United States Patent
Hardy et al.

(10) Patent No.: US 9,208,587 B2
(45) Date of Patent: Dec. 8, 2015

(54) SYSTEMS AND METHODS FOR COMPRESSED SENSING FOR MULTI-SHELL MAGNETIC RESONANCE IMAGING

(71) Applicant: General Electric Company, Schenectady, NY (US)

(72) Inventors: Christopher Judson Hardy, Niskayuna, NY (US); Luca Marinelli, Niskayuna, NY (US); Marion Irene Menzel, Garching b. Munchen (DE); Ek Tsoon Tan, Niskayuna, NY (US); Jonathan Immanuel Sperl, Garching b. Munchen (DE)

(73) Assignee: General Electric Company, Niskayuna, NY (US)

(*) Notice: Subject to any disclaimer, the term of this patent is extended or adjusted under 35 U.S.C. 154(b) by 0 days.

(21) Appl. No.: 14/261,623

(22) Filed: Apr. 25, 2014

(65) Prior Publication Data

US 2015/0310640 A1    Oct. 29, 2015

(51) Int. Cl.
- *G06K 9/00* (2006.01)
- *G06T 11/00* (2006.01)
- *G06T 7/00* (2006.01)

(52) U.S. Cl.
CPC .............. *G06T 11/006* (2013.01); *G06T 7/0012* (2013.01); *G06T 2207/10088* (2013.01); *G06T 2207/20056* (2013.01)

(58) Field of Classification Search
CPC ..................... G01R 33/5611; G01R 33/56341; G01R 33/4828; G01R 33/5601; G01R 33/5607; G01R 33/561; G01R 33/5615; G01R 33/56308; G01R 33/5635; G01N 24/08; G06T 5/007
See application file for complete search history.

(56) References Cited

U.S. PATENT DOCUMENTS

| | | | | |
|---|---|---|---|---|
| 6,614,226 B2 * | 9/2003 | Wedeen | ........................ | 324/309 |
| 7,034,531 B1 * | 4/2006 | Tuch et al. | .................... | 324/309 |
| 7,495,440 B2 * | 2/2009 | Chiang et al. | ................. | 324/309 |
| 7,688,068 B2 * | 3/2010 | Beatty | ........................... | 324/307 |
| 8,564,289 B2 * | 10/2013 | Tseng et al. | .................. | 324/309 |

(Continued)

FOREIGN PATENT DOCUMENTS

| | | |
|---|---|---|
| CN | 103033784 A | 4/2013 |
| WO | 2013140276 A1 | 9/2013 |

OTHER PUBLICATIONS

Merlet, Sylvain et al., "Compressed Sensing for Accelerated EAP Recovery in Diffusion MRI", HAL, Sep. 24, 2010, 12pgs.

(Continued)

*Primary Examiner* — Tom Y Lu

(74) *Attorney, Agent, or Firm* — Melissa K. Dobson

(57) ABSTRACT

A method of compressed sensing for multi-shell magnetic resonance imaging includes obtaining magnetic resonance imaging data, the data being sampled along multi-shell spherical coordinates, the spherical coordinates coincident with a plurality of spokes that converge at an origin, constructing a symmetric shell for each respective sampled multi-shell to create a combined set of data, performing a three-dimensional Fourier transform on the combined set of data to reconstruct an image, and de-noising the reconstructed image by iteratively applying a sparsifying transform on non-sampled data points of neighboring shells. The method can also include randomly under-sampling the imaging data to create missing data points. A system configured to implement the method and a non-transitory computer readable medium are also disclosed.

15 Claims, 5 Drawing Sheets

(56) References Cited

U.S. PATENT DOCUMENTS

| | | | | |
|---|---|---|---|---|
| 8,717,024 | B2* | 5/2014 | King et al. | 324/309 |
| 2003/0135105 | A1* | 7/2003 | Jack et al. | 600/410 |
| 2012/0249136 | A1 | 10/2012 | Marinelli et al. | |
| 2013/0089271 | A1 | 4/2013 | Boernert et al. | |
| 2013/0278257 | A1 | 10/2013 | Boada et al. | |

OTHER PUBLICATIONS

Usman, Muhammad et al., "Motion Corrected Compressed Sensing for Free-Breathing Dynamic Cardiac MRI", Magnetic Resonance in Medicine, vol. 70, Issue 2, (2013), DOI: 10.1002/mrm.24463, (pp. 504-516, 13 total pages).

Khare, Kedar et al., "Accelerated MR Imaging Using Compressive Sensing with No Free Parameters", Magnetic Resonance in Medicine, vol. 68, Issue 5, (2012), DOI: 10.1002/mrm.24143, (pp. 1450-1457, 8 total pages).

Wu, Yin et al., "Accelerated MR Diffusion Tensor Imaging Using Distributed Compressed Sensing", Magnetic Resonance in Medicine, vol. 71, (2014), DOI: 10.1002/mrm.24721, (pp. 763-772, 10 total pages).

Rathi Yogesh et al., "Sparse multi-shell diffusion imaging", Med Image Comput Comput Assist Interv., Author Mnauscript, vol. 14, Issue 02, 2011, (pp. 58-65, 10 total pages).

* cited by examiner

SYSTEMS AND METHODS FOR COMPRESSED SENSING FOR MULTI-SHELL MAGNETIC RESONANCE IMAGING

BACKGROUND

Magnetic Resonance Imaging (MRI) techniques can be utilized for the clinical evaluation of various diseases. Some of these techniques use compressed sensing. One such compressed sensing MRI technique performs accelerated Diffusion Spectrum Imaging (DSI). In DSI, the information is encoded in both q-space (Cartesian sampling) or diffusion space and image space. The q-space information may then be used to characterize the diffusion properties of water molecules.

By applying a series of diffusion encoding gradient pulses in multiple directions and strengths, a three-dimensional characterization of the water diffusion process may be generated at each spatial location (image voxel). The MR signal in q-space is generally related to the water displacement probability density function at a fixed echo time by the Fourier transform. The diffusion information encoded in q-space may be separated into both angular and radial components. The angular component reflects the underlying tissue anisotropy, whereas the radial component provides information about the eventual geometric restrictions in the diffusion process.

Conventional DSI techniques provide acceptable information for the diffusion properties of water in the brain or other organs. However, the high dimensionality of DSI (i.e., three dimensional in both spatial and in q-space domains) requires the patient to be scanned for an extended period of time, which substantially limits the effectiveness of the conventional DSI technique when utilized in vivo.

DETAILED DESCRIPTION

Figure 1:
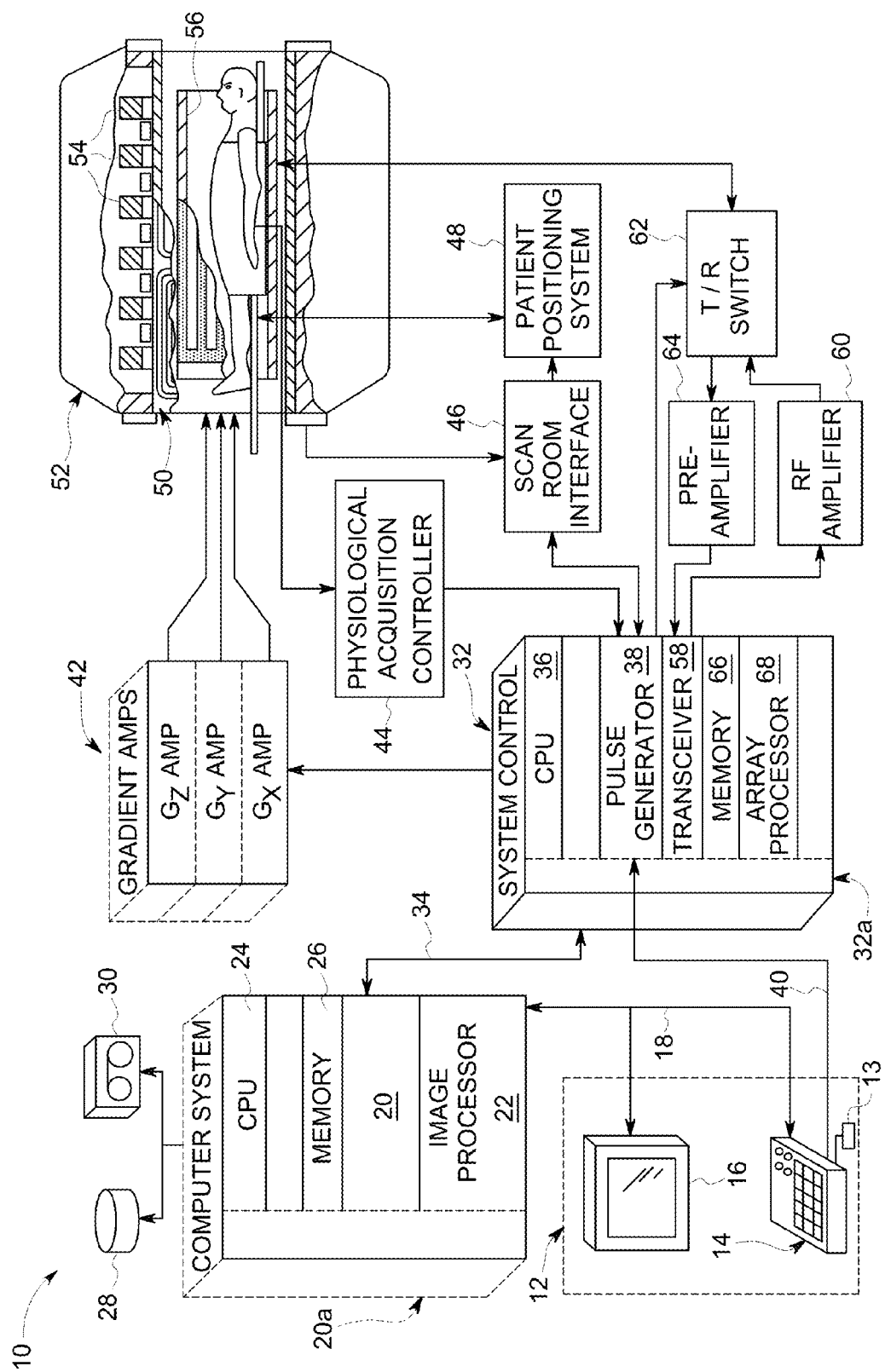
FIG. 1 depicts an MRI system in accordance with some embodiments.

In accordance with embodiments, systems and methods perform a compressed sensing (CS), multi-shell diffusion MR acquisition, where the diffusion encoding space (q-space) is sampled on multiple concentric spherical shells. The encoding space can be randomly under-sampled. Then the missing data points are synthesized using prior knowledge about the properties of the data.

In accordance with implementations, a one-dimensional (1D) Fourier transform is used for the reconstruction and a total variation operator defined on a shell is used for de-noising. Initial results show that a 150 data point multi-shell acquisition could be under-sampled by a factor of about 1.5 (e.g., yielding 100 data points). Thus, reducing scan times by about one-third of the original scan time, without significant loss of information with respect to kurtosis—a metric computed using multi-shell acquisition.

Conventional CS approaches apply under-sampling in k-space. For these approaches despite the benefits of CS in k-space (de-noising etc.), the total scan time is dominated by the number of data points in q-space. Embodying systems and methods significantly reduce data acquisition (e.g., exam scan) time by being able to under-sample in q-space, and still provide these other benefits. Further, conventional sampling in Cartesian coordinates requires a one-dimensional Fourier transform plus a total variation (TV) on-the-shell reconstruction scheme. Embodying systems and methods reconstruct images by applying a three-dimensional Fourier transform plus Cartesian based TV (or some other sparsifying transform—e.g., wavelet decomposition). Additionally, conventional CS-DSI typically reduces the number of data points from 515 down to about 150. Embodying systems and methods can, for example, reduce a 150 data point acquisition by about one-third.

Embodying systems and methods can be applied to a large variety of techniques. By way of example, in conventional Diffusion Kurtosis Imaging (DKI) data is sampled in a series of concentric shells in q-space. Typical DKI acquisition schemes consist of five shells with thirty directions per shell requiring 150 data points in total. Obtaining these data points can result in a scan time on the order of five to ten minutes. Several methods have been proposed to accelerate the spherical acquisitions by under-sampling the multi-shell data and reconstructing the missing data points using compressed sensing (CS). These methods work by exploiting the sparsity of the spherical ridgelet coefficients within a shell.

In accordance with embodying implementations, the number of acquired data points is reduced to yield a linear reduction in scan time. This reduction in scan time can improve the clinical applicability of DKI. Embodying systems and methods make use of properties of the data across shells. Similar to the three-dimensional Fourier relation between q-space and the diffusion propagator space (r-space) exploited in CS-accelerated Diffusion Spectrum Imaging (DSI), the 1D Fourier relation between a radial line in q-space and its reciprocal space is used to reconstruct a bundle of 1D propagators which are regularized by a non-Cartesian total variation (TV) operator.

FIG. 1 depicts components of MRI system 10 in accordance with some embodiments. System 10 can be controlled from operator console 12, which can include a keyboard or other input device 13, a control panel 14, and a display 16. Console 12 communicates through communication network 18 with a computer system 20. Computer system 20 can include computer executable instructions that when executed enable an operator to control the production and display of images on screen 16. Computer system 20 can include a number of modules which communicate with each other through a backplane 20a. These modules can include image processor module 22, CPU module 24, and memory module 26, known in the art as a frame buffer for storing image data arrays. The computer system 20 is linked to disk storage 28 and tape drive 30 for storage of image data and programs (i.e., computer executable instructions). The computer system can communicate MRI imaging system control 32 through network 18 and/or high speed serial link 34. Input device 13 can include a mouse, joystick, keyboard, track ball, touch screen, light wand, voice control, or similar device, and may be used for interactive geometry prescription.

MRI imaging system control 32 can include a set of modules connected together by backplane 32*a*. These modules can include CPU module 36 and pulse generator module 38 which connects to the operator console through serial link 40. System control 32 receives commands through serial link 40 from the operator. These commands can indicate, for example, the scan sequence that is to be performed. Pulse generator module 38 operates the system components to carry out the desired scan sequence and produces data which indicates the timing, strength and shape of the RF pulses produced, and the timing and length of the data acquisition window. The pulse generator module connects to a set of gradient amplifiers 42, to indicate the timing and shape of the gradient pulses that are produced during the scan. Pulse generator module 38 also receives patient data from physiological acquisition controller 44 that receives signals from a number of different sensors connected to the patient, such as ECG signals from electrodes attached to the patient. Further, pulse generator module 38 connects to a scan room interface circuit 46 which receives signals from various sensors associated with the condition of the patient and the magnet system. It is also through scan room interface circuit 46 that a patient positioning system 48 receives commands to move the patient to the desired position for the scan.

The gradient waveforms produced by the pulse generator module 38 are applied to gradient amplifier system 42 having Gx, Gy, and Gz amplifiers. Each gradient amplifier excites a corresponding physical gradient coil in an assembly generally designated 50 to produce the magnetic field gradients used for spatially encoding acquired signals. Gradient coil assembly 50 forms part of magnet assembly 52 which includes polarizing magnet 54 and whole-body RF coil 56. Transceiver module 58 in system control 32 produces pulses which are amplified by RF amplifier 60 and coupled to RF coil 56 by transmit/receive switch 62. The resulting signals emitted by the excited nuclei in the patient may be sensed by the same RF coil and coupled through the transmit/receive switch to preamplifier 64. The amplified MR signals are demodulated, filtered, and digitized in the receiver section of transceiver 58. The transmit/receive switch is controlled by a signal from pulse generator module 38 to electrically connect RF amplifier 60 to coil 56 during the transmit mode and to connect preamplifier 64 during the receive mode. The transmit/receive switch also enables a separate RF coil (for example, a surface coil) to be used in either transmit or receive mode.

The MR signals picked up by the RF coil 56 are digitized by the transceiver module 58 and transferred to memory module 66 in the system control 32. This raw k-space data can be rearranged into separate k-space data arrays for each image to be reconstructed, and each of these is input to array processor 68 which can execute instructions to perform the embodying methods described herein. The image data can be conveyed through the serial link to computer system 20 where it is stored in disk memory 28. In response to commands received from operator console 12, image data may be archived on tape drive 30, or it may be further processed by image processor 22 and presented on display 16.

Embodying systems and methods are suitable for use with the above-referenced MR system, or any similar or equivalent system for obtaining MR images.

Figure 2:
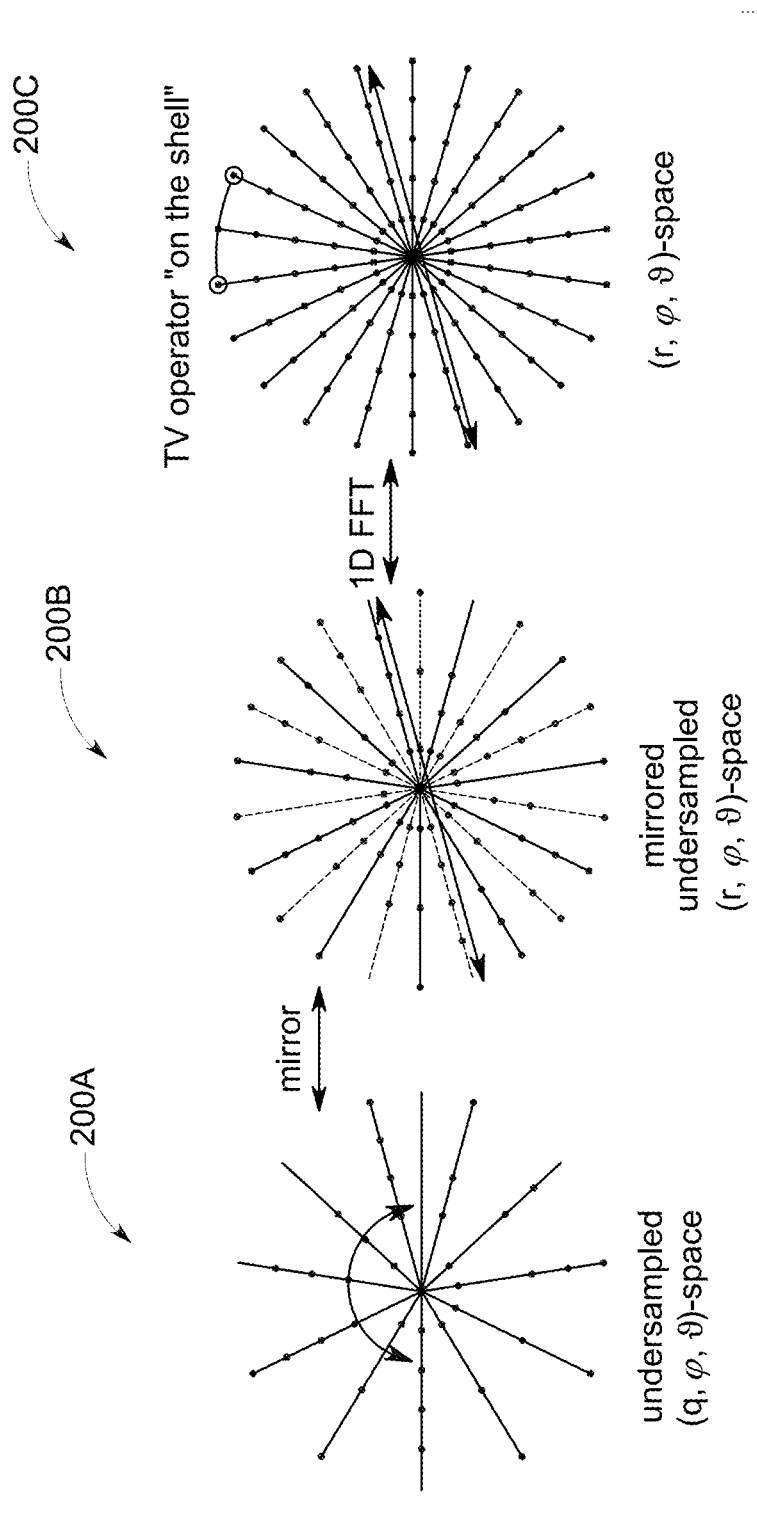
FIG. 2 depicts data spaces and transforms for compressed sensing multi-shell MRI in accordance with some embodiments.

FIG. 2 depicts in two dimensions data spaces and transforms 200A, 200B, 200C for compressed-sensing multi-shell MRI in accordance with some embodiments. In practice, the data spaces are three-dimensional (with data falling on spheres instead of circles). Data space 200A represents a multi-shell diffusion acquisition where the data is sampled on spokes with an equidistant spacing in q; characterized by the diffusion gradient strength q; and spherical coordinates φ and θ. Data space 200B represents the effect of exploiting q-space symmetry, where the data can be mirrored at the origin yielding a point-symmetric data set. Performing a 1D Fourier transform along each mirrored spoke in q-space yields a bundle of (real valued) 1D propagators in the (r, φ, θ)-space (data space 200C). The data in the (r, φ, θ)-space are also sampled on a series of shells. This data can be assumed to vary smoothly within each shell because typical propagators vary slowly with direction. Because of the smooth variation, a non-Cartesian TV operator can be introduced on a shell.

For example, consider the set $N_i$ of indices of J neighbors of the i-th spoke ($\phi_i$, $\theta_i$) in circular order around the spoke. A typical choice for the number of neighbors considered would be J=6, forming a hexagon around the spoke. Hence the root sum of the squared finite differences of the propagator bundle p(r, φ, θ) around the i-th spoke and the k-th shell can be expressed as Equation 1:

$$FD_{k,i}(p) = \sqrt{\Sigma j \in N_i, \atop j \leq \frac{J}{2}} \left( \frac{p(r_k, \varphi_j, \vartheta_j) - p\left(r_k, \varphi_{\frac{J}{2}+j}, \vartheta_{\frac{J}{2}+j}\right)}{s_{i,j} + s_{i\frac{J}{2}+j}} \right)^2 \quad \text{(EQ. 1)}$$

Equation 1 is weighted by the distances $s_{i,j}$ between the i-th spoke and its j-th neighbor. Note that indexing pairs j and J/2+j in the left and right summands, respectively, are used to address neighbors lying opposite one another with respect to the center of the hexagon. Hence the TV of the propagator p can be expressed as Equation 2:

$$TV(p) = \Sigma_{i,k} FD_{k,i}(p). \quad \text{(EQ. 2)}$$

The TV operator now serves as a regularizer in the reconstruction task expressed as Equation 3:

$$\min_p \|MF_p - d\|_2 + \lambda TV(p) \quad \text{(EQ. 3)}$$

where d denotes the under-sampled and mirrored q-space data;
F the 1D Fourier transform;
M the under-sampling mask; and
λ a scaling parameter.

Equation (3) can be solved using an Iterative Shrinkage/Thresholding Algorithm (ISTA) yielding an optimum propagator $p_{opt}$. Subsequently, the q-space signal (including the missing data points) can be recovered as $Fp_{opt}$.

Experiments in accordance with embodiments were conducted on a healthy volunteer. Imaging was done with a 3T GE MR750 clinical MR scanner (GE Healthcare, Milwaukee, Wis.) using a 32-channel head coil (single shot EPI, single spin echo, TE=84.3 ms, TR=1.8 s, 96×96, FOV=24 cm) and a 5-shell DKI acquisition with 30 directions per shell, equidistant sampling in q and $b_{max}$=3,000 s/mm². In addition, b=0-images were acquired every 20-th image and used for affine motion correction.

In order to simulate accelerated acquisitions, the data were artificially under-sampled using acceleration factors R=1.25, R=1.5, R=1.75, and R=2 (corresponding to 120, 100, 85, and 75 data points, respectively) and a series of 50 pattern instances per acceleration factor. A method embodying CS-reconstruction was performed for all under-sampled data sets. Additional diffusion MRI data of the same volunteer and identical imaging parameters, consisting of a 515 point DSI acquisition and another 150 point multi-shell acquisition, was combined with the fully sampled data and used as a "ground truth" data set. Using weighted linear least squares, diffusion and kurtosis tensors were fitted for the ground truth (GT), the fully sampled ($DKI_{full}$), the under-sampled ($DKI_{us}$) and the CS-reconstructed ($DKI_{CS}$) data sets.

Typical diffusion and kurtosis metrics such as fractional anisotropy (FA), mean ($K_{mean}$), maximum ($K_{max}$), and orthogonal ($K_{orth}$) kurtosis were computed for all fitted tensors. Furthermore, the apparent kurtosis coefficient (AKC) was computed for 512 directions (isotropically distributed on the unit sphere) and its root mean squared error (RMSE) with respect to the GT was determined for every voxel.

Figure 3:
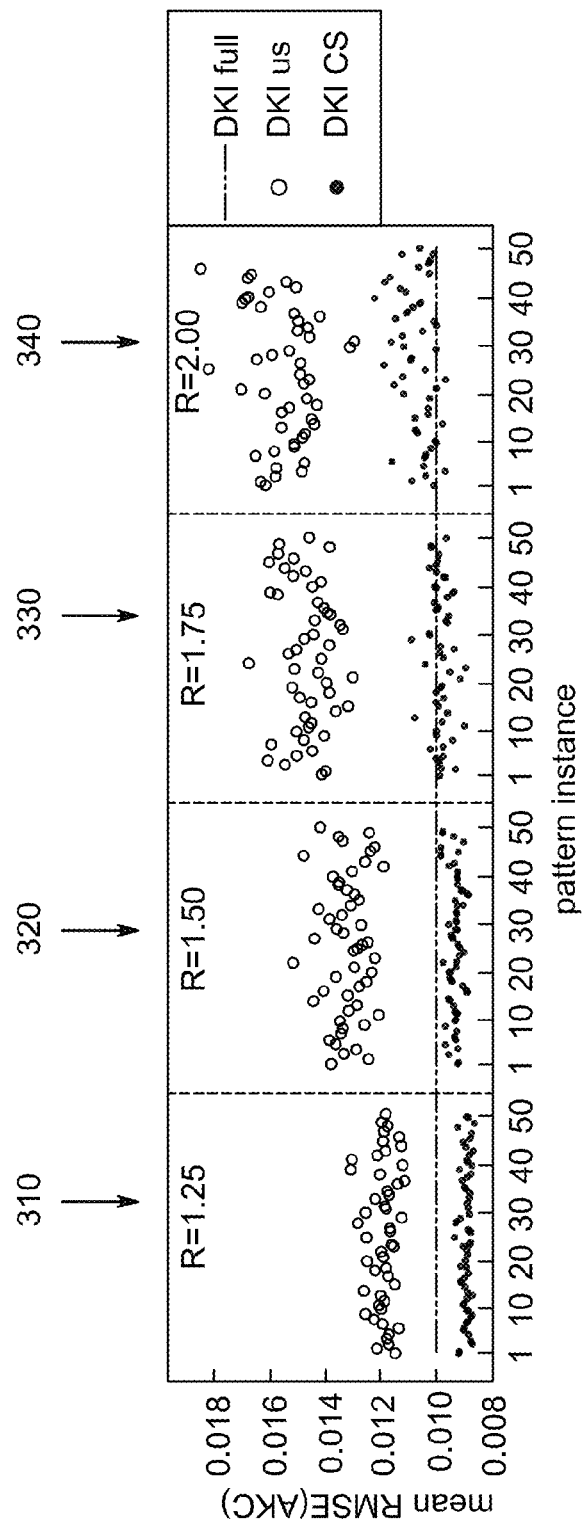
FIG. 3 depicts average root mean squared error/apparent kurtosis coefficient for various under-sampled patterns in accordance with some embodiments.

FIG. 3 depicts average RMSE (AKC) 210, 220, 230, 240 for various under-sampled patterns in accordance with embodiments, where acceleration factor R=1.25, 1.50, 1.75, and 2.00 respectively. As illustrated in FIG. 3, the error of $DKI_{cs}$ (obtained by implementing embodiments) is lower than the error for $DKI_{us}$ data for the depicted acceleration factors. Further, the $DKI_{CS}$ data is below the error of $DKI_{full}$ for all values of the acceleration factor up to an acceleration factor of R=1.75.

Figure 4:
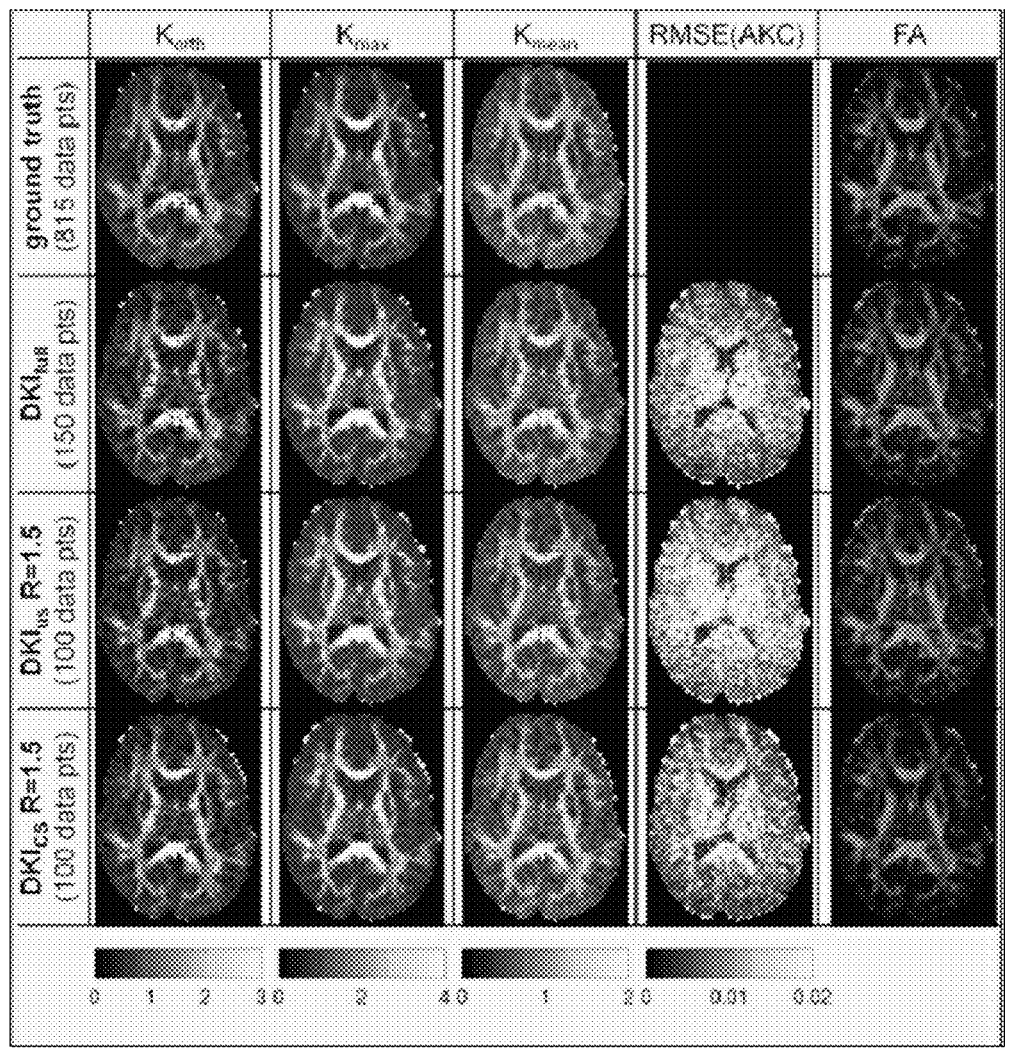
FIG. 4 depicts resulting kurtosis, average root mean squared error/apparent kurtosis coefficient, and fractional anisotropy maps for a single under-sampled pattern in accordance with some embodiments.

FIG. 4 depicts the resulting kurtosis ($K_{orth}$, $K_{max}$, $K_{mean}$), RMSE (AKC), and FA maps for a single under-sampled pattern in accordance with some embodiments, where the acceleration factor R=1.5. For $DKI_{CS}$ (obtained via embodying implantations), the kurtosis maps appear less noisy, and have a better structural preservation compared to $DKI_{us}$-obtained results. The $DKI_{cs}$ results appear to be of the same quality as the results obtained via the $DKI_{full}$ process. Also the RMSE (AKC) of the $DKI_{cs}$ results is reduced, and its FA map is slightly de-noised. In accordance with embodiments, the compressed sensing reconstruction method for multi-shell acquisitions allows acceleration of typical DKI acquisition by a factor of R=1.75 without significant loss in the quality of derived kurtosis metrics.

Figure 5:
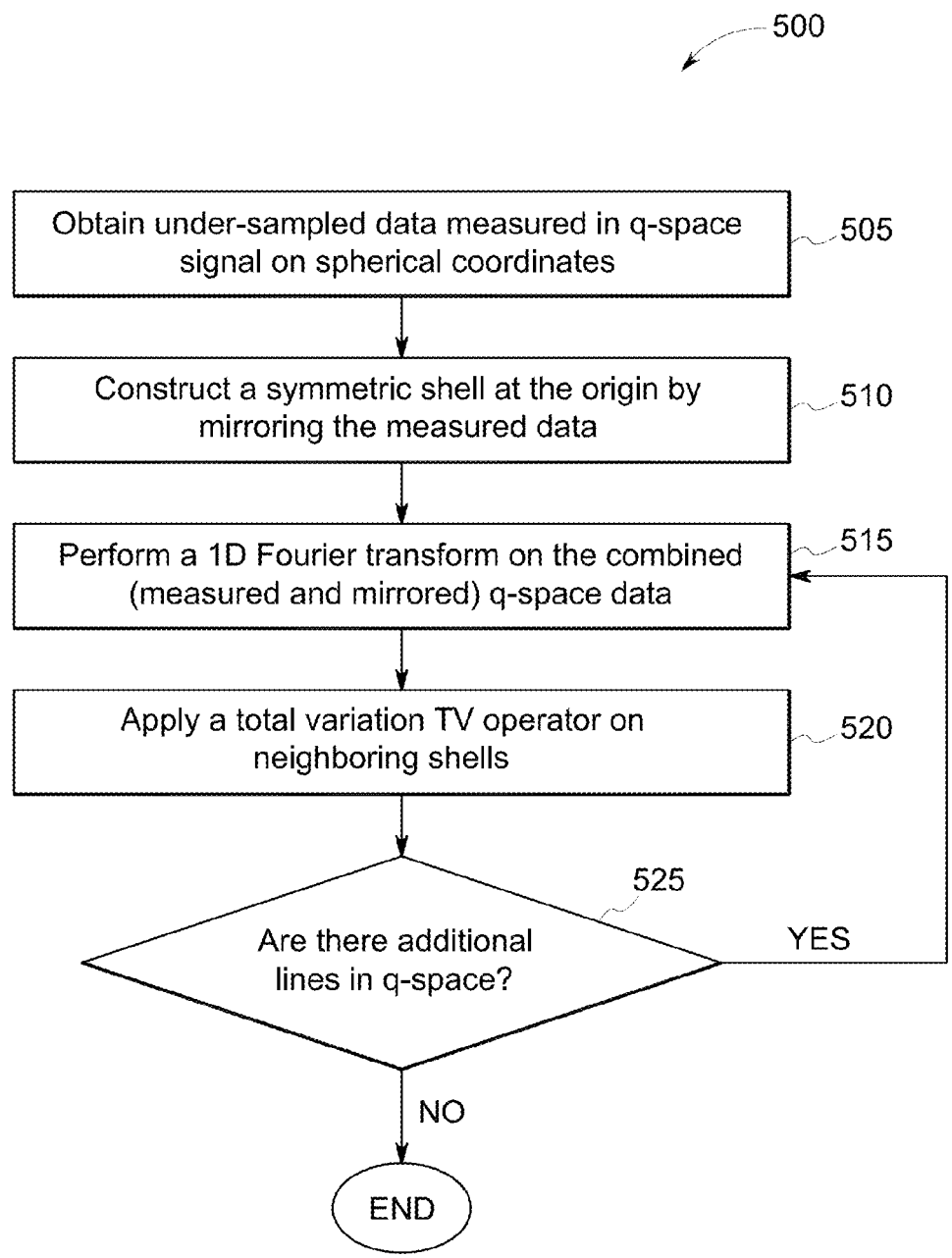
FIG. 5 depicts a compressed-sensing for multi-shell diffusion MRI acquisitions reconstruction process in accordance with some embodiments.

FIG. 5 depicts compressed sensing for multi-shell diffusion MRI acquisitions reconstruction process 500 in accordance with some embodiments. Process 400 begins with obtaining, step 505, under-sampled data in q-space, where the data is acquired on concentric spherical shells. The under-sampling can be done based on a mask M. The under-sampling mask can be set to randomly omit data samples on the shells. In accordance with some embodiments, mask criteria can provide upper and/or lower limits for the number of sampled data points per shell; or limits on the number of sampled data points per spoke. In one implementation, the data can be sampled on spokes with equidistant spacing in q (i.e., identical shells with different scaling).

A symmetric shell can be constructed, step 510, by mirroring the measured data across the q-space origin. The mirroring can occur across a line orthogonal to the sampled shell's radius. A Fourier transform is then performed, step 515, on the combined (i.e., measured and mirrored) q-space data to obtain a reconstructed r-space (i.e., propagator space) signal. A total variation (TV) operator is applied, step 520, on shell neighbors to fill in the non-sampled data. The TV operator can be scaled using a weighting parameter.

Process 500 can be an iterative procedure that is performed for each line in q-space, step 525. A three-dimensional Fourier transform can convert the q-space measured data to the r-space signal. Accordingly, a one-dimensional Fourier transform is performed on each of the q-space lines to yield one-dimensional propagators. Performing the loop of steps 515-525 for all lines in q-space results in a bundle of 1D-propagators.

If there are additional lines, the process continues back to step 515. In one implementation, the iterative procedure can include applying ISTA to obtain yield an optimum propagator $p_{opt}$ (see EQ. 3). Subsequently, the q-space signal (including the missing data points) can be recovered as $Fp_{opt}$. Embodying systems and methods are limited to a particular algorithm to obtain the optimum propagator.

An embodying system for compressed sensing multi-shell MRI in accordance with some embodiments can include an magnetic resonance imaging system for data acquisition. The system also includes a control processor which coordinates activities of x-ray source, detector storage and readout. Further the control processor accesses computer instructions that cause the processor to process detector pixel data in accordance with embodying methods as described above.

In accordance with some embodiments, a computer program application stored in non-volatile memory or computer-readable medium (e.g., register memory, processor cache, RAM, ROM, hard drive, flash memory, CD ROM, magnetic media, etc.) may include code or executable instructions that when executed may instruct and/or cause a controller or processor to perform methods discussed herein such as performing a compressed sensing, multi-shell diffusion MR acquisition, where the diffusion encoding space (q-space) is randomly under-sampled on concentric spherical shells and then reconstructed using prior knowledge about the properties of the data, as described above.

The computer-readable medium may be a non-transitory computer-readable media including all forms and types of memory and all computer-readable media except for a transitory, propagating signal. In one implementation, the non-volatile memory or computer-readable medium may be external memory.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A method of compressed sensing for multi-shell magnetic resonance imaging, the method comprising:
    providing a magnetic resonance imaging system including a control processor, gradient amplifiers, a radio frequency amplifier, and a pulse generator, wherein the control processor is in communication with the gradient amplifiers, the radio frequency amplifier, and the pulse generator, and wherein the control processor executes computer-readable instructions that cause the control processor to perform the steps of:
    obtaining magnetic resonance imaging data, the data being sampled along multiple concentric spherical shells, the spherical shells coincident with a plurality of spokes that converge at an origin;
    constructing a symmetric shell for each respective sampled shell to create a combined set of data;
    performing a three-dimensional Fourier transform on the combined set of data to reconstruct an image; and
    de-noising the reconstructed image by iteratively applying a sparsifying transform on non-sampled data points of neighboring shells.

2. The method of claim 1, including randomly under-sampling the imaging data to create missing data points.

3. The method of claim 2, including synthesizing the missing data points by applying prior knowledge about the under-sampled data points.

4. The method of claim 1, the constructing step including mirroring sampled data coincident with at least a portion of the plurality of sampled spokes along a spoke across the origin from the respective sampled spokes.

5. The method of claim 1, the de-noising step including applying a total variation operator by using one of an iterative shrinkage and thresholding algorithm and wavelet decomposition.

6. A non-transitory computer readable medium having stored thereon instructions which when executed by a processor cause the processor to perform a method of multi-shell magnetic resonance imaging, the method comprising:
    obtaining magnetic resonance imaging data, the data being sampled along multiple concentric spherical shells, the spherical shells coincident with a plurality of spokes that converge at an origin;
    constructing a symmetric shell for each respective sampled shell to create a combined set of data;
    performing a three-dimensional Fourier transform on the combined set of data to reconstruct an image; and
    de-noising the reconstructed image by iteratively applying a sparsifying transform on non-sampled data points of neighboring shells.

7. The medium of claim 6, including instructions to cause the processor to perform the step of randomly under-sampling the imaging data to create missing data points.

8. The medium of claim 7, including instructions to cause the processor to perform the step of synthesizing the missing data points by applying prior knowledge about the under-sampled data points.

9. The medium of claim 6, including instructions to cause the processor to perform the constructing step by including mirroring sampled data coincident with at least a portion of the plurality of sampled spokes along a spoke across the origin from the respective sampled spokes.

10. The medium of claim 6, including instructions to cause the processor to perform the de-noising step by including applying a total variation operator by using one of an iterative shrinkage and thresholding algorithm and wavelet decomposition.

11. A system for compressed sensing for multi-shell magnetic resonance imaging, the system comprising:
    a magnetic resonance imaging system including a control processor, gradient amplifiers, a radio frequency amplifier, and a pulse generator, wherein the control processor is in communication with the gradient amplifiers, the radio frequency amplifier, and the pulse generator;
    the control processor configured to execute computer-readable instructions that cause the control processor to perform a method including:
    obtain magnetic resonance imaging data, the data being sampled along multiple concentric spherical shells, the spherical shells coincident with a plurality of spokes that converge at an origin;
    construct a symmetric shell for each respective sampled shell to create a combined set of data;
    perform a three-dimensional Fourier transform on the combined set of data to reconstruct an image; and
    de-noise the reconstructed image by iteratively applying a sparsifying transform on non-sampled data points of neighboring shells.

12. The system of claim 11, including instructions to cause the control processor to randomly under-sample the imaging data to create missing data points.

13. The system of claim 12, including instructions to cause the control processor to synthesize the missing data points by applying prior knowledge about the under-sampled data points.

14. The system of claim 11, including instructions to cause the control processor to perform the constructing step by mirroring sampled data coincident with at least a portion of the plurality of sampled spokes along a spoke across the origin from the respective sampled spokes.

15. The system of claim 11, including instructions to cause the control processor to perform the de-noising step by the including applying a total variation operator by using one of an iterative shrinkage and thresholding algorithm and wavelet decomposition.

* * * * *